(12) United States Patent
Chen

(10) Patent No.: US 10,672,315 B2
(45) Date of Patent: Jun. 2, 2020

(54) ARRAY SUBSTRATE, DISPLAY PANEL, DISPLAY APPARATUS AND CURRENT MEASURING METHOD

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventor: Lei Chen, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/321,739

(22) PCT Filed: Jun. 3, 2017

(86) PCT No.: PCT/CN2017/091054
§ 371 (c)(1),
(2) Date: Jan. 29, 2019

(87) PCT Pub. No.: WO2018/028334
PCT Pub. Date: Feb. 15, 2018

(65) Prior Publication Data
US 2019/0164462 A1 May 30, 2019

(30) Foreign Application Priority Data
Aug. 8, 2016 (CN) .......................... 2016 1 0640979

(51) Int. Cl.
*G09G 3/00* (2006.01)
*G09G 3/3233* (2016.01)
(Continued)

(52) U.S. Cl.
CPC ........... *G09G 3/006* (2013.01); *G09G 3/3233* (2013.01); *H01L 27/124* (2013.01);
(Continued)

(58) Field of Classification Search
CPC .... G09G 3/006; G09G 3/3291; G09G 3/3233; G09G 3/3208; G09G 3/00;
(Continued)

(56) References Cited

U.S. PATENT DOCUMENTS 7,445,946 B2 * 11/2008 Yamazaki .......... H05B 33/0812
257/E21.57
8,232,935 B2 7/2012 Mitomi et al.
(Continued)

FOREIGN PATENT DOCUMENTS

| CN | 101325022 A | 12/2008 |
|---|---|---|
| CN | 104103231 A | 10/2014 |

(Continued)

OTHER PUBLICATIONS

First Chinese Office Action dated Dec. 12, 2017, received for corresponding Chinese Application No. 201610640979.8.
(Continued)

*Primary Examiner* — Amit Chatly
(74) *Attorney, Agent, or Firm* — Kinney & Lange, P.A.

(57) ABSTRACT

The embodiments of the present disclosure provide an array substrate, a display panel, a display apparatus and a current measuring method. The array substrate may include: a plurality of pixel units and sensing lines. Each of the pixel units may include a driving transistor, and the sensing line is configured to transmit an output of the driving transistor to a sensing device. At least two of the plurality of driving transistors may have their outputting terminals connected in series. Outputting terminals of adjacent driving transistors of the at least two of the driving transistors may be connected
(Continued)

through a first switching element. At least one of the driving transistor of the at least two of the driving transistors may have an outputting terminal connected to the sensing line through a second switching element.

17 Claims, 7 Drawing Sheets

(51) Int. Cl.
 *H01L 27/12* (2006.01)
 *G09G 3/3291* (2016.01)
(52) U.S. Cl.
 CPC ... *G09G 3/3291* (2013.01); *G09G 2300/0426* (2013.01); *G09G 2300/0452* (2013.01); *G09G 2300/0809* (2013.01)
(58) Field of Classification Search
 CPC ... G09G 2300/0809; G09G 2300/0426; G09G 2300/0452; H01L 27/124
 See application file for complete search history.

(56) References Cited

U.S. PATENT DOCUMENTS

| | | | |
|---|---|---|---|
| 9,013,372 B2 | 4/2015 | Mitomi et al. | |
| 9,129,927 B2 | 9/2015 | Gupta et al. | |
| 9,165,501 B2 | 10/2015 | Mitomi et al. | |
| 9,412,799 B2 | 8/2016 | Chang et al. | |
| 9,548,027 B2 | 1/2017 | Mitomi et al. | |
| 9,564,478 B2 | 2/2017 | Chang et al. | |
| 9,805,652 B2 | 10/2017 | Han et al. | |
| 9,818,765 B2 | 11/2017 | Osawa et al. | |
| 10,096,622 B2 | 10/2018 | Gupta et al. | |
| 2006/0055631 A1 | 3/2006 | Yoshida | |
| 2007/0195248 A1* | 8/2007 | Huh | G02F 1/13624 349/139 |
| 2007/0222881 A1 | 9/2007 | Mentzer | |
| 2014/0139411 A1* | 5/2014 | Jinta | G09G 3/3233 345/80 |
| 2014/0292739 A1 | 10/2014 | Kim et al. | |
| 2014/0333680 A1 | 11/2014 | Choi | |
| 2015/0055047 A1 | 2/2015 | Chang et al. | |
| 2016/0012799 A1 | 1/2016 | Kim | |
| 2016/0204165 A1* | 7/2016 | Yang | H01L 27/323 345/174 |
| 2016/0268364 A1* | 9/2016 | Yin | G09G 3/3233 |
| 2019/0006394 A1 | 1/2019 | Gupta et al. | |

FOREIGN PATENT DOCUMENTS

| | | | |
|---|---|---|---|
| CN | 104112427 | * | 10/2014 |
| CN | 104143312 A | | 11/2014 |
| CN | 105304022 A | | 2/2016 |
| CN | 105321472 A | | 2/2016 |
| CN | 105408813 A | | 3/2016 |
| CN | 106023893 A | | 10/2016 |
| EP | 2801969 A1 | | 11/2014 |
| KR | 20150057190 A | | 5/2015 |

OTHER PUBLICATIONS

International Search Report and Written Opinion dated Aug. 18, 2017, received for corresponding PCT Application No. PCT/CN2017/091054.

* cited by examiner

ARRAY SUBSTRATE, DISPLAY PANEL, DISPLAY APPARATUS AND CURRENT MEASURING METHOD

CROSS-REFERENCE TO RELATED APPLICATION(S)

This application is a Section 371 National Stage Application of International Application No. PCT/CN2017/091054, which in turn claims the priority of Chinese Patent Application No. 201610640979.8 filed on Aug. 8, 2016, the disclosure of which is incorporated herein by reference in its entirety.

TECHNICAL FIELD

The present disclosure relates to the field of display technology, in particular, to an array substrate, a display panel, a display apparatus and a current measuring method.

BACKGROUND

In the field of display technology, organic light-emitting diodes (OLED) have been widely used. In display panels, driving transistors can generate a driving current according to a data voltage, so as to drive the OLED to emit light for displaying. Threshold voltages of the driving transistors may affect the correspondence between the data voltage and the driving current. Different driving transistors may have different threshold voltages. Further, the threshold voltage of the same driving transistor may be varied over time. Therefore, it is not always to obtain the same driving current with respect to the same data voltage, which may cause the display panel to emit light non-uniformly.

SUMMARY

The embodiments of the present disclosure may provide an array substrate, a display panel, a display apparatus and a current measuring method.

The first aspect of the present disclosure may provide an array substrate, comprising: a plurality of pixel units and sensing lines. Each of the pixel units may comprise a driving transistor, and the sensing line is configured to transmit an output of the driving transistor to a sensing device. At least two of the plurality of driving transistors may have their outputting terminals connected in series. Outputting terminals of adjacent driving transistors of the at least two of the driving transistors may be connected through a first switching element. At least one of the driving transistor of the at least two of the driving transistors may have an outputting terminal connected to the sensing line through a second switching element.

As an example, the pixel unit may comprise a plurality of driving transistors. At least two of the plurality of driving transistors in the pixel unit may have their outputting terminals connected in series. Adjacent driving transistors of the at least two of the driving transistors in the pixel unit may have their outputting terminals connected through a first switching element. At least one of the driving transistor of the at least two of the driving transistors in the pixel unit may have an outputting terminal connected to the sensing line through a second switching element.

As an example, all of driving transistors in the pixel unit may have their outputting terminals connected in series through a plurality of first switching elements, and one of the driving transistors in the pixel unit may have its outputting terminal connected to the sensing line through the second switching element.

As an example, the plurality of first switching elements in the pixel unit may have controlling terminals on which same controlling voltages are applied.

As an example, the plurality of first switching elements in the pixel unit may have controlling terminals on which different controlling voltages are applied.

As an example, the driving transistors with their outputting terminals connected in series may have controlling terminals on which different controlling signals are applied.

As an example, the pixel unit may further comprise a first transistor, a capacitor and a light emitting element. The first transistor may be connected to the capacitor and configured to write a data voltage into the capacitor. The capacitor may be connected to the driving transistor and configured to store the data voltage. The driving transistor may be connected to the light emitting element, and configured to drive the light emitting element to emit light according to the data voltage.

As an example, the light emitting element may be an organic electroluminescence unit.

As an example, the first switching element and the second switching element may be switching transistors.

As an example, the array substrate may comprise a plurality of columns of pixel units and a plurality of sensing lines, wherein one sensing line is connected to one column of pixel units.

The second aspect of the present disclosure may provide a display panel comprising the array substrate discussed above.

The third aspect of the present disclosure may provide a display apparatus comprising the display panel discussed above.

The fourth aspect of the present disclosure may provide a current measuring method for measuring a driving current outputted from the driving transistor of the array substrate discussed above, comprising: turning on a switching element between an outputting terminal of a driving transistor to be detected and the sensing line, so as to connect the detected driving transistor and the sensing line electronically; driving the driving transistor to be detected to generate a driving current; and measuring the driving current through the sensing line.

As an example, the driving transistor may be for driving an organic electroluminescence unit. The current measuring method may further comprise: applying a reference voltage lower than a turn-on voltage of the organic electroluminescence unit to the outputting terminal of the driving transistor to be detected through the sensing line.

As an example, measuring the driving current through the sensing line may comprise: detecting a change of the voltage of the sensing line during a preset period; and obtaining a value of the driving current according to the change of the voltage of the sensing line during the preset period.

As an example, the driving transistor may be for driving an OLED. The current measuring method may further comprise: applying a reference voltage lower than a turn-on voltage of the OLED to the outputting terminal of the driving transistor to be detected through the sensing line.

As an example, measuring the driving current through the sensing line may comprise: detecting a change of the voltage of the sensing line during a preset period; and obtaining a value of the driving current according to the change of the voltage of the sensing line during the preset period.

BRIEF DESCRIPTION OF THE DRAWINGS

In order to describe solutions of the embodiments of the present disclosure more clearly, the accompanying drawings will be described briefly hereinafter. It should be noted that the accompanying drawings in the following description only relate to some embodiments of the present disclosure, but not to limiting the present disclosure, in which.

DETAILED DESCRIPTION

To make solutions and advantages of the embodiments of the present disclosure more comprehensible, the solutions of the embodiments of the present disclosure will be described clearly and completely with reference to the accompanying drawings. Obviously, the described embodiments are only a part but not all of the embodiments of the present disclosure. All other embodiments obtained by persons skilled in the art based on the described embodiments of the present disclosure without creative efforts shall also fall within the scope of the present disclosure.

Figure 1:
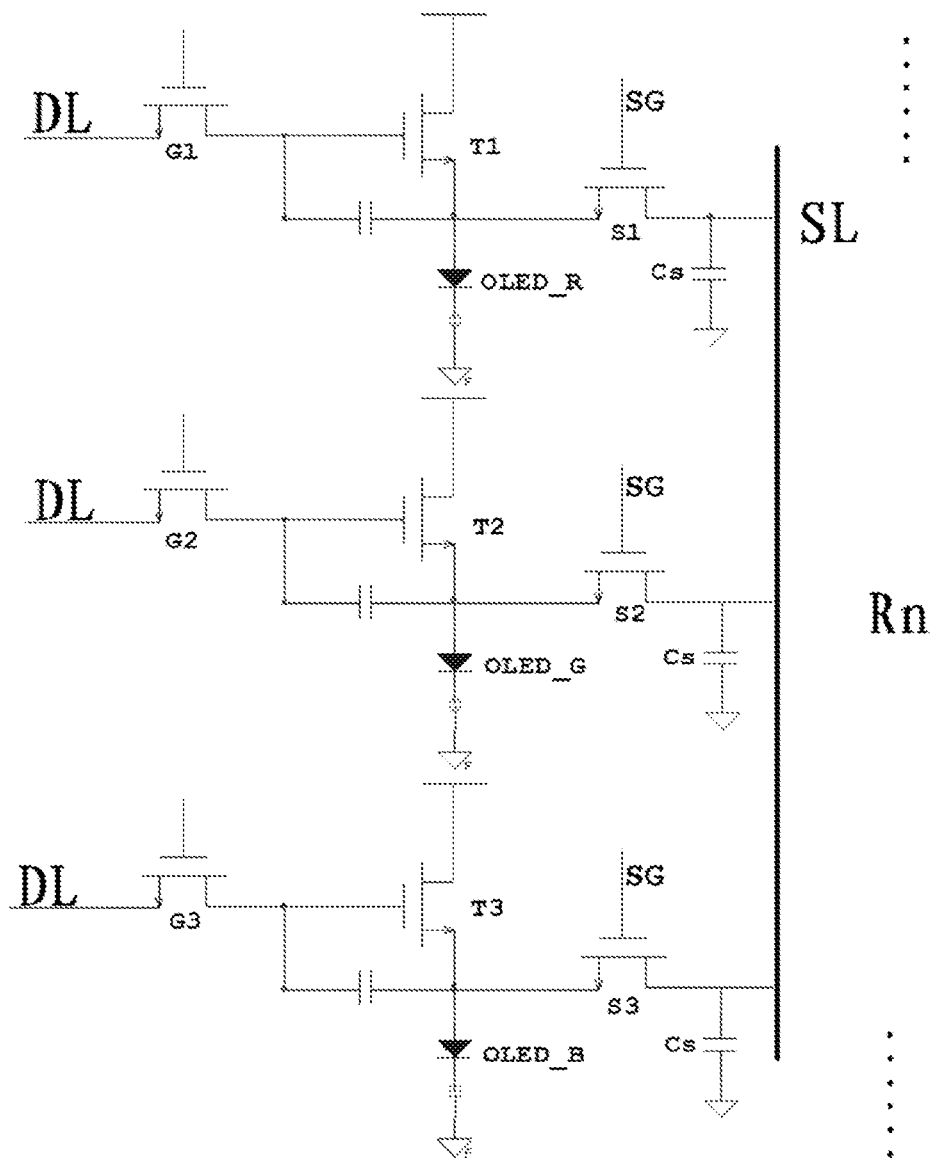
FIG. 1 is a schematic circuit diagram illustrating an array substrate which is capable of detecting a current of a driving transistor.

FIG. 1 is a schematic circuit diagram illustrating an array substrate which is capable of detecting a current of a driving transistor. As shown in FIG. 1, the array substrate may comprise a pixel unit and a sensing line SL. The pixel unit may comprise a plurality of sub-pixel units. Each of the sub-pixel unit may comprise driving transistors T1, T2 and T3 respectively. The array substrate may further comprise a plurality of switching elements S1, S2 and S3. Each of the driving transistors T1, T2 and T3 has an outputting terminal connected to the sensing line SL through the switching element.

In a case that the array substrate comprises a plurality of pixel units arranged in a matrix, the driving transistors in a column of pixel units may be connected with one sensing line SL. Rn represents that an illustrated pixel unit is located at the nth line of the column of pixel units.

During a displaying stage, the switching elements S1, S2 and S3 are turned off. The driving transistors T1, T2 and T3 are connected to a data line DL through controlling switches G1, G2 and G3, respectively. A driving current is generated according to a data voltage on the data line, so as to drive light emitting elements OLED-R (Red), OLED-G (Green) and OLED-B (Blue) to emit light, thereby displaying.

During a current measuring stage, the plurality of switching elements S1, S2 and S3 corresponding to the pixel units to be detected are turned on. Driving transistors in any sub-pixel unit of the pixel units to be detected is driven to generate the driving current. The driving current is measured through the sensing line SL.

The measure of the driving current through the sensing line SL may comprise detecting a change of the voltage of the sensing line SL during a preset period; and obtaining a value of the driving current according to the change of the voltage of the sensing line SL during the preset period.

In a case that the switching elements S1, S2 and S3 of the pixel unit to be detected are turned on, the driving transistors T1, T2 and T3 are connected to the sensing line. The switching elements of the pixel units which are not detected are turned off. One of the driving transistors T1, T2 and T3 is controlled to generate the driving current, which may charge a plurality of parasitic capacitor Cs connected to the sensing line. The voltage on the sensing line SL is increased gradually. According to the change $\Delta V$ of the voltage during the preset period $\Delta T$, the current can be calculated, i.e. $I=Csa*\Delta V/\Delta T$, wherein Csa indicates for the equivalent capacitance of all parasitic capacitors Cs. The parasitic capacitor Cs relates to the switching element connected to the sensing line SL, and will be always present regardless if the switching element is turned off.

According to the circuit structure of FIG. 1, the array substrate may comprise 1920*1080 pixel units. Taken each pixel unit having three sub-pixel units as an example, there are 3*1080 switching elements connected with respect to each sensing line SL. Csa is substantially equal to 3*1080*Cs, which may require a long time for charging, so as to obtain a big enough $\Delta V$.

The embodiments of the present disclosure provide an array substrate comprising a plurality of pixel units and sensing lines. Each of the pixel unit may comprise a driving transistor, and the sensing line may be configured to transmit an output of the driving transistor to a sensing device. At least two of the plurality of driving transistors may have their outputting terminals connected in series. Outputting terminals of adjacent driving transistors of the at least two of the driving transistors are connected in series through a first switching element. At least one of the driving transistor of the at least two of the driving transistors has an outputting terminal connected to the sensing line through a second switching element.

The number of outputting terminals connected to the sensing line through the second switching element may be less than the number of the driving transistors connected in series. In addition, the driving transistors which are not connected in series may have their outputting terminals connected to the sensing line directly through a third switching element.

Among the driving transistors connected in series, only the outputting terminal of at least one driving transistor is required to connect to the sensing line through the second switching element. That is, the controlling of the first and second switching elements enables any of the driving transistors connected in series electrically connecting to the sensing line. This may reduce the number of switching elements which need to be directly connected to the sensing line, thereby reducing the equivalent capacitance and expediting the charge process.

As an example, the pixel unit may comprise a plurality of driving transistors. At least two of the plurality of driving transistors in the pixel unit may have their outputting terminals connected in series. Adjacent driving transistors of the at least two of the driving transistors in the pixel unit may have their outputting terminals connected through a first switching element. At least one of the driving transistor of the at least two of the driving transistors in the pixel unit may have an outputting terminal connected to the sensing line through a second switching element.

The number of outputting terminals connected to the sensing line through the second switching element may be less than the number of the driving transistors connected in series. In addition, the driving transistors which are not connected in series may have their outputting terminals connected to the sensing line through a third switching element.

Normally, the sensing of the driving transistors is performed on a basis of a pixel unit. Thus, due to the improvement on the connection in the pixel units, the number of switching elements which need to be directly connected to the sensing line is reduced, thereby reducing the equivalent capacitance and expediting the charge process.

As an example, all of driving transistors in the pixel unit may have their outputting terminals connected in series through a plurality of first switching elements, and one of the driving transistors in the pixel unit may have its outputting terminal connected to the sensing line through the second switching element. This may enable that only one switching element is directly connected to the sensing line in the pixel unit.

Figure 2:
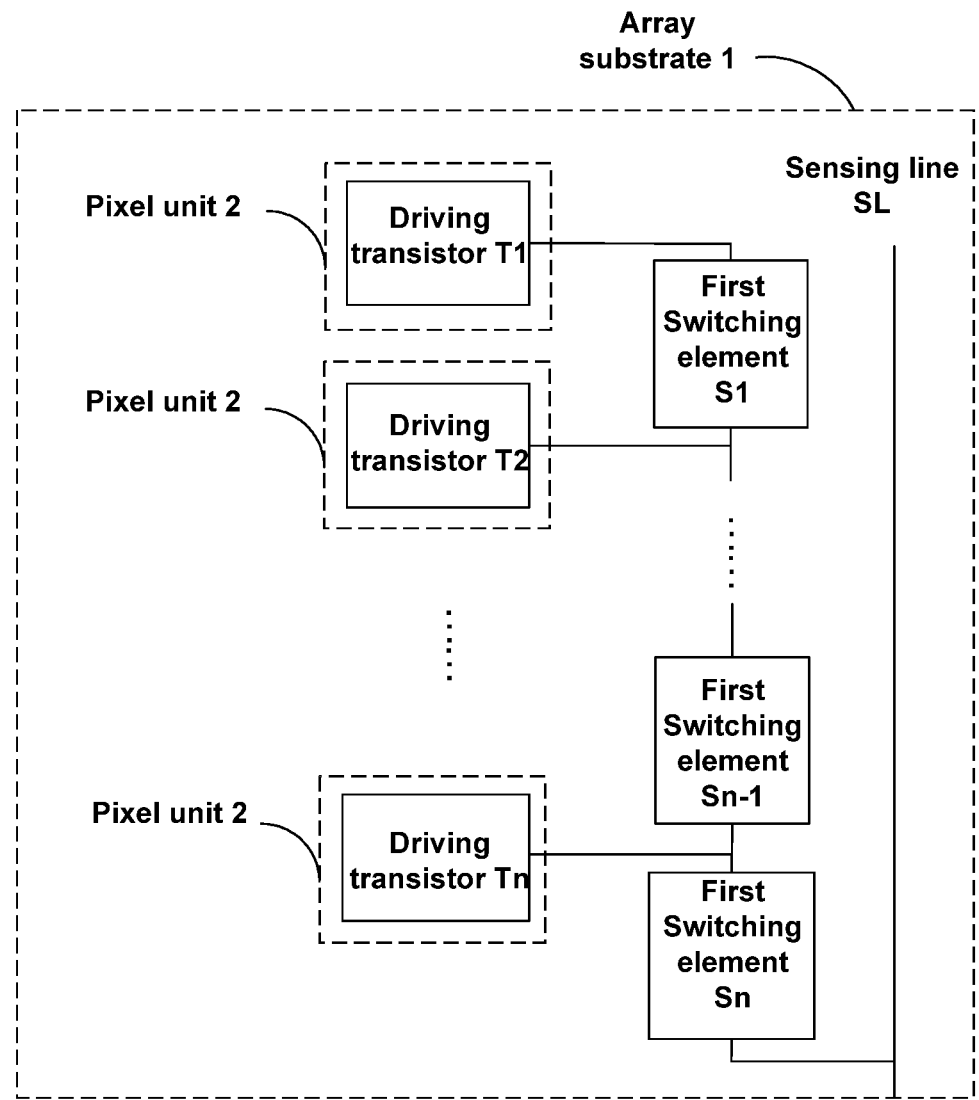
FIG. 2 is a first schematic diagram illustrating the array substrate according to an embodiment of the disclosure.

FIG. 2 is a first schematic diagram illustrating the array substrate according to an embodiment of the disclosure. As an example, as shown in FIG. 2, the array substrate 1 may comprise a plurality of pixel units 2 and a sensing line SL. The pixel unit 2 may comprise a driving transistor, and the sensing line SL may be configured to transmit an output of the driving transistor to the sensing device. The array substrate may further comprise a plurality of switching elements S1, S2, ..., Sn, which are configured to connect the outputting terminals of the driving transistors of a plurality of sub-pixel units (T1, T2, ..., Tn) in series and connected to the sensing line SL, so that: adjacent driving transistors (such as, between T1 and T2) have their outputting terminals connected through a first switching element; and at least one driving transistor (such as, Tn) has an outputting terminal connected to the sensing line SL through a second switching element. The term "adjacent" means adjacency in the series circuit structure, which may or may not correspond to the adjacency in physical location. The driving transistor connected to the sensing line SL may be any of the plurality of driving transistors T1, T2, ..., Tn. The switching elements S1, S2, ..., Sn may be the same circuit elements. In the example, the switching elements S1, S2, ..., Sn−1 may be referred to as the first switching elements, and the switching element Sn may be referred to as the second switching element.

Figure 3:
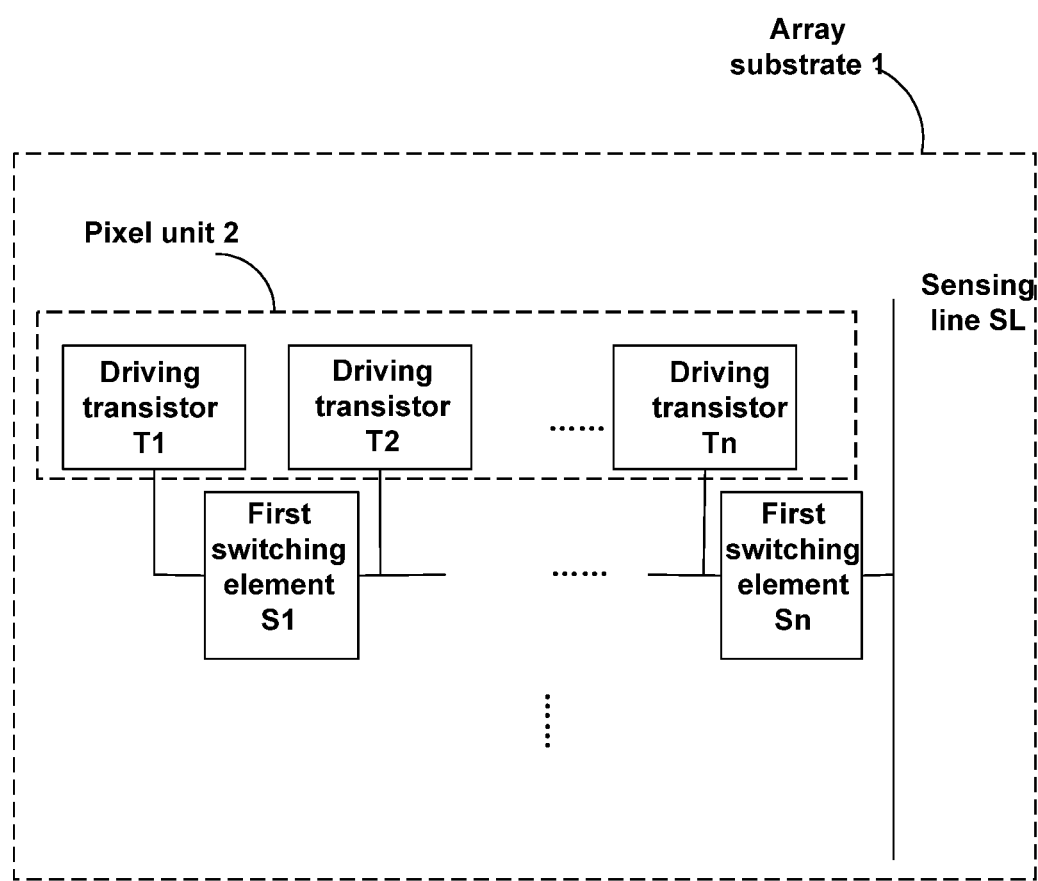
FIG. 3 is a second schematic diagram illustrating the array substrate according to an embodiment of the disclosure.

FIG. 3 is a second schematic diagram illustrating the array substrate according to an embodiment of the disclosure. For an example, as shown in FIG. 3, the pixel unit 2 may comprise a plurality of sub-pixel units. Each of a plurality of sub-pixel units may comprise a driving transistor. That is, the pixel unit 2 may comprise a plurality of driving transistors T1, T2, ..., Tn. In FIG. 3, For the convenience of description, the driving transistors T1, T2, ... Tn are arranged in the same row. However, this is not a limitation on the physical structure. In a practical application, depending on an arrangement of the sub-pixels, the driving transistors may be arranged in the same column or may be arranged in a triangle or the like.

In the pixel unit 2, driving transistors T1, T2, ... Tn may have their outputting terminals connected in series through a plurality of first switching elements S1, S2, ..., Sn−1, and the driving transistor Tn has its outputting terminal connected to the sensing line through the second switching element Sn. In an example of FIG. 3, when the sensing line SL is connected to the outermost transistor Tn, the number of switching elements which need to be directly connected to the sensing line SL can be reduced as more as possible.

It should be noted that all driving transistors T1, T2, ... Tn with their outputting terminals connected in series are shown in FIG. 3, i.e. all driving transistors in the pixel unit have their outputting terminals connected in series through a plurality of first switching elements and one of the driving transistors in the pixel unit has its outputting terminal connected to the sensing line through the second switching element. However, it is not necessary.

Figure 4:
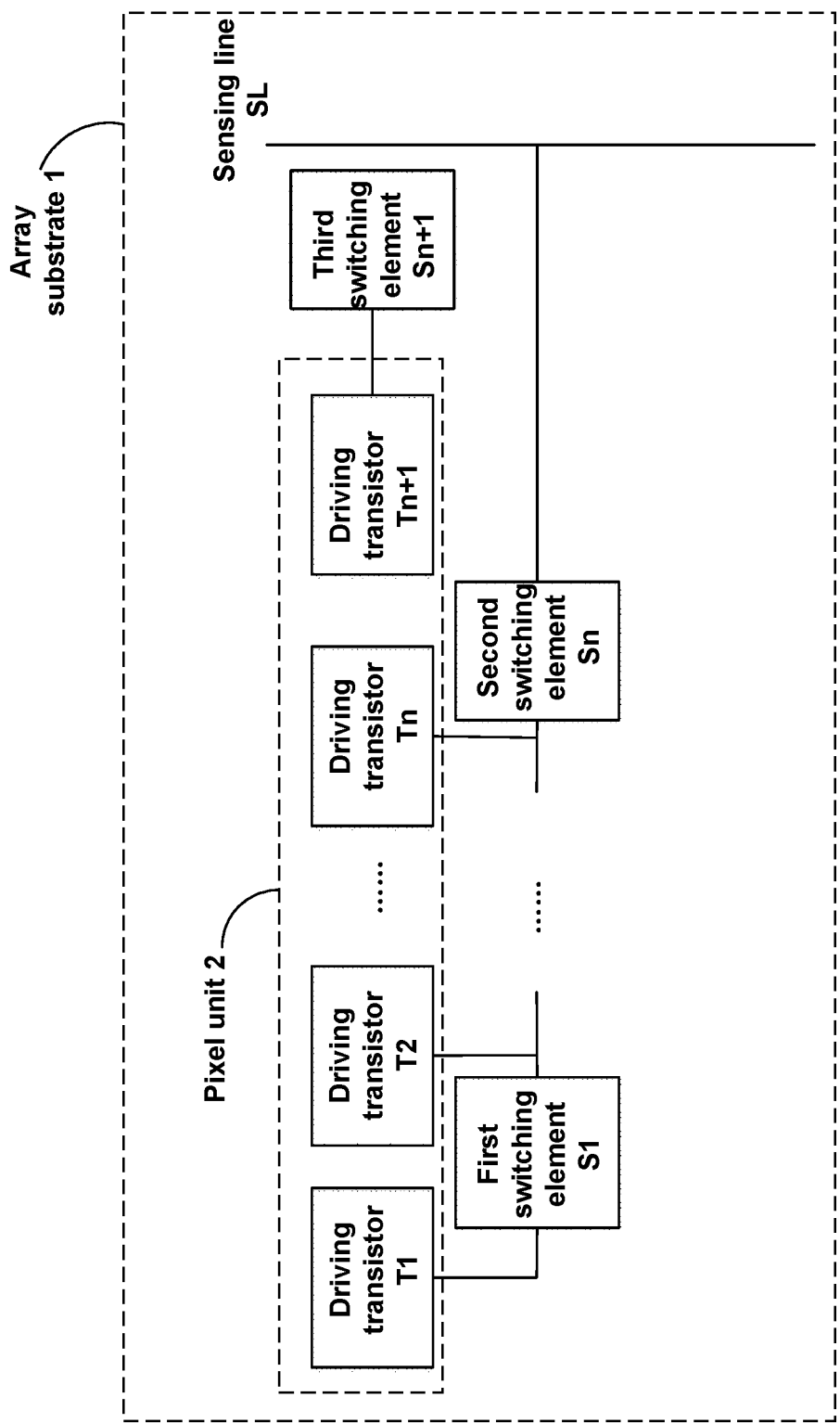
FIG. 4 is a third schematic diagram illustrating the array substrate according to an embodiment of the disclosure.

FIG. 4 is a third schematic diagram illustrating the array substrate according to an embodiment of the disclosure. As shown in FIG. 4, a part of the driving transistors may not be connected in series, but connected to the sensing line directly. For example, the transistors T1, T2, ... Tn are connected in series, while the transistor Tn is connected to the sensing line through a switching element. However, the transistor Tn+1 is not in a series connection, but directly connected to the sensing line through a third switching element Sn+1. All of these solutions will fall within the scope of the embodiments of the present disclosure and may all contribute to reducing the time required for charging.

Figure 5:
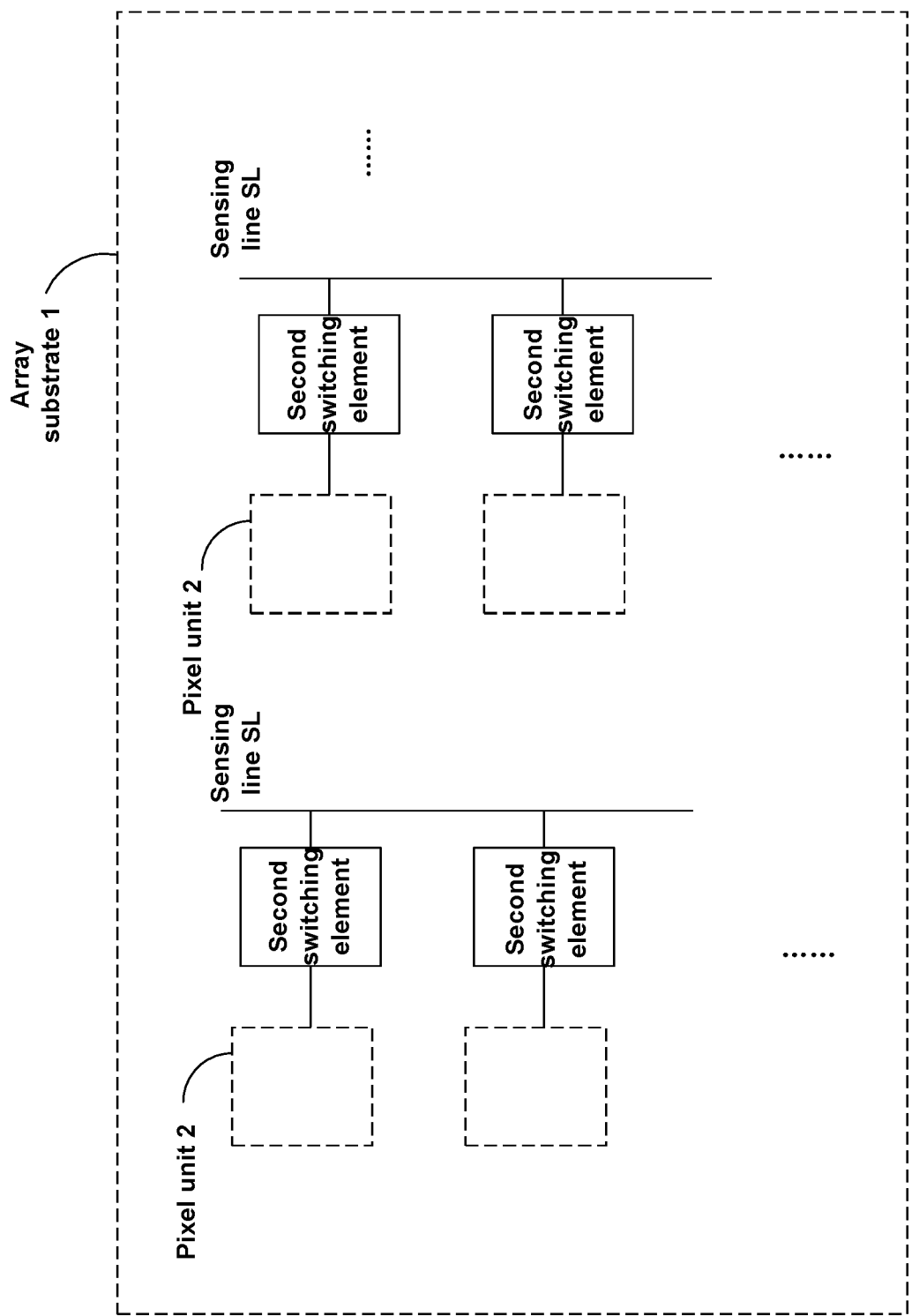
FIG. 5 is a fourth schematic diagram illustrating the array substrate according to an embodiment of the disclosure.

FIG. 5 is a fourth schematic diagram illustrating the array substrate according to an embodiment of the disclosure. The array substrate 1 may comprise a plurality of columns of pixel units 2 and a plurality of sensing lines SL. Each of the sensing lines SL may connected to one column of pixel units 2.

Figure 6:
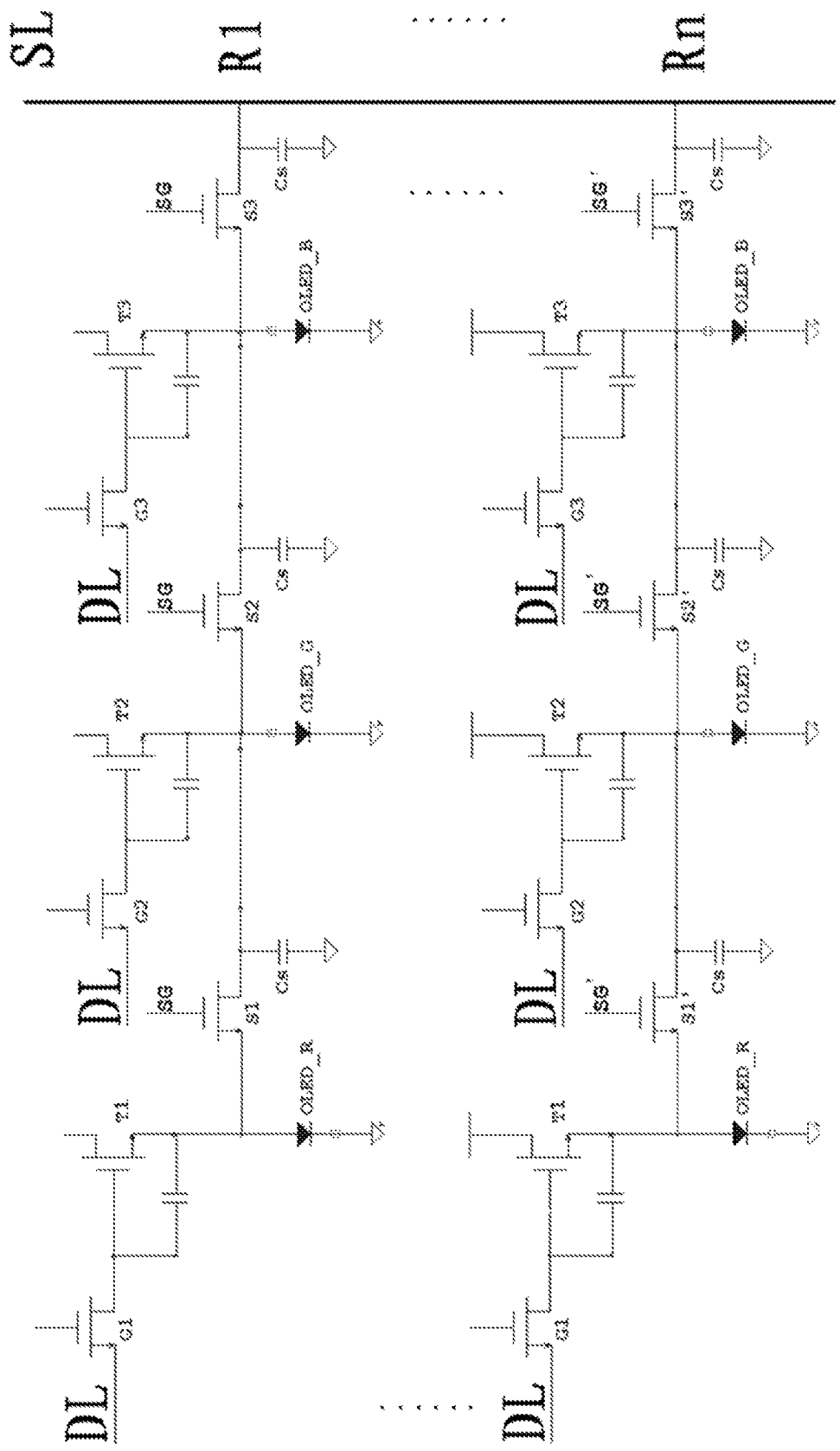
FIG. 6 is a schematic circuit diagram illustrating the array substrate of FIG. 3.

FIG. 6 is a schematic circuit diagram illustrating the array substrate of FIG. 3. As shown in FIG. 6, with respect to each pixel unit, there are three sub-pixel units. The array substrate may comprise a plurality of columns of pixel units and a plurality of sensing lines. One sensing line is connected to one column of pixel units. The pixel unit may further include a first transistor G1, G2, G3 (as a controlling switch), a capacitor, and light-emitting units OLED_R, OLED_G and OLED_B. The first transistor is connected to the capacitor and configured to write a data voltage into the capacitor. The capacitor is connected to the driving transistors T1, T2, T3 and configured to store the data voltage. The driving transistors T1, T2 and T3 are connected to the light-emitting units OLED_R, OLED_G and OLED_B, and configured to drive the light-emitting units OLED_R, OLED_G and OLED_B to emit light according to the data voltage. The light-emitting units OLED_R, OLED_G, OLED_B may be organic electroluminescent units (OLEDs).

As shown in FIG. 6, the switching elements are switching transistors S1, S2 and S3. The switching transistors S1, S2 and S3 may have controlling terminals on which different controlling voltages are applied. For example, the switching transistors S1, S2 and S3 in one pixel unit may have the controlling terminals connected together and controlled by the sensing controlling line SG. The switching transistors S1', S2' and S3' in the other pixel unit may have the controlling terminals connected together and controlled by another sensing controlling line SG'. In this way, the number of the controlling lines can be reduced. The switching transistor S1 may drive the outputting terminals of the transistors T1 and T2 in series. The switching transistor S2 may drive the outputting terminals of the transistors T2 and T3 in series. The switching transistor S3 may connect the outputting terminal of the driving transistor T3 with the sensing line SL. The switching transistors S1, S2 may be referred to as a first switching transistor and the switching transistor S3 may be referred to as a second switching transistor. The case where the third switching transistor is additionally used is not shown in FIG. 6, but it should be understood that the outputting terminal of any of the driving transistors may be directly connected to the sensing line through the third switching transistor. For example, the outputting terminal of the driving transistor T1 may be not connected to the outputting terminals of the driving transistors T2 and T3 in series, but connected to the sensing line through the third switching transistor.

During a displaying stage, as same as the circuit illustrated in FIG. 1, the switching elements S1, S2 and S3 are turned off. The driving transistors T1, T2 and T3 are connected to a data line DL through controlling switches G1, G2 and G3, respectively. A driving current is generated according to a data voltage on the data line, so as to drive light emitting elements OLED-R (Red), OLED-G (Green) and OLED-B (Blue) to emit light, thereby displaying.

During a current measuring stage, the switching elements S1, S2 and S3 of the pixel units to be detected are turned on, the driving transistors T1, T2 and T3 are connected to the sensing line, and the switching elements of the pixel units which are not detected are turned off. One of the driving transistors T1, T2 and T3 is controlled to generate the driving current, and others are turned off. The driving current may charge a plurality of parasitic capacitor Cs connected to the sensing line. The voltage on the sensing line SL is increased gradually. According to the change $\Delta V$ of the voltage during the preset period $\Delta T$, the current can be calculated, i.e. $I=Csa*\Delta V/\Delta T$, wherein Csa indicates for the equivalent capacitance of all parasitic capacitors Cs.

In contrast to the circuit shown in FIG. 1, the value of the equivalent capacitance Csa may be varied. According to the circuit structure of FIG. 6, a description is made by still taking the array substrate comprising 1920*1080 pixel units and each pixel unit including three sub-pixel units as an example. With respect to the sensing line SL, the pixel unit to be detected may have 3 connected switching elements, and the pixel units which are not detected may only have 1 connected switching element. Thus, there are 1079+3 sub-pixel units connected to the sensing line SL. Csa is substantially equal to $1080*Cs+2*Cs$, which reduces the value of the equivalent capacitance Csa significantly, thereby expediting the charge process and meeting the requirements of a higher precision and refresh frequency.

The embodiments of the present disclosure may further provide a display panel comprising the array substrate discussed above.

The embodiments of the present disclosure may further provide a display apparatus comprising the display panel discussed above. The display apparatus may be a cell phone, a tablet, a television, a display, a notebook, a digital album, a navigation device and products or components which may have a display function.

Figure 7:
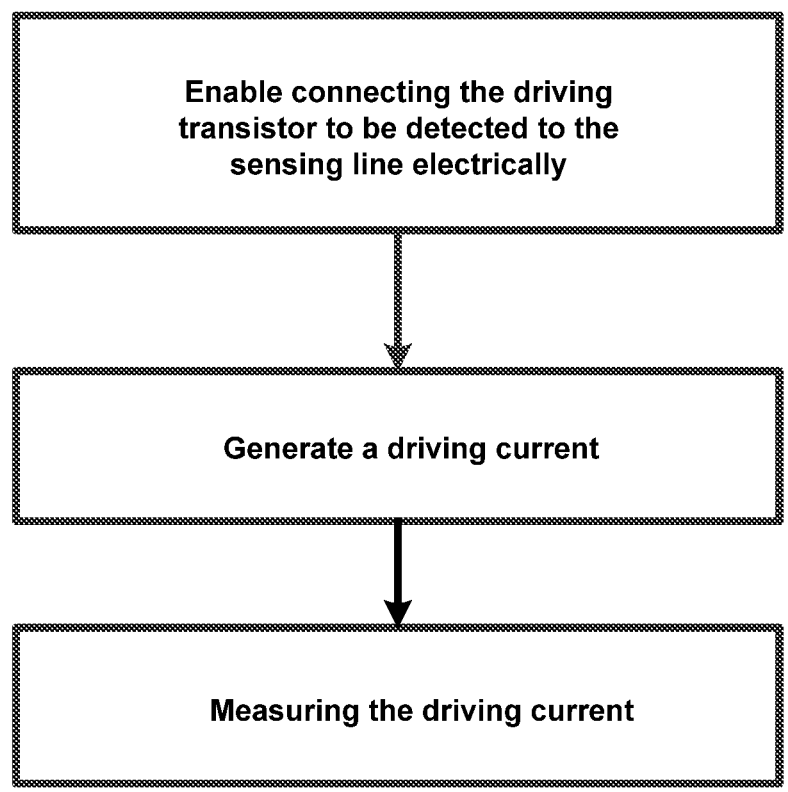
FIG. 7 is a flowchart illustrating a current measuring method according to an embodiment of the disclosure.

FIG. 7 is a flowchart illustrating a current measuring method according to an embodiment of the disclosure. As shown in FIG. 7, the current measuring method involved in the above description comprises turning on a switching element between an outputting terminal of a driving transistor to be detected and the sensing line, so as to connect the driving transistor and the sensing line electronically, and driving the driving transistor to be detected to generate a driving current; and measuring the driving current through the sensing line.

Measuring the driving current through the sensing line may comprise: detecting a change of the voltage of the sensing line during a preset period; and obtaining a value of the driving current according to the change of the voltage of the sensing line during the preset period.

In addition, as described above, when the driving transistor is used for driving the OLED, the measuring method may further comprise applying a reference voltage lower than a turn-on voltage of the OLED to the outputting terminal of the driving transistor to be detected through the sensing line. During measurement, the voltage across the OLED is kept less than its turn-on voltage, which enables that the OLED is kept in turned off state and no current will go through the OLED. Thus, the accuracy of the current measurement can be ensured. It should be noted that the current required in the measurement process is actually very small. After the parasitic capacitance is charged, the voltage variation on the sensing line is negligible and the OLED emission voltage is usually not observed. This makes it possible to keep the OLED in a turned off state According to the array substrate, the display panel, the display apparatus and the current measuring method of the present disclosure, the speed for measuring the current of the driving transistor can be increased. It can be understood that the above embodiments are merely exemplary embodiments used for illustrating the principle of the present disclosure, and the disclosure is not limited thereto. For those skilled in the art, various modifications and improvements may be made without departing from the spirit and essence of the present disclosure, and these variations and improvements are also considered as the scope of the present disclosure.

I claim:

1. An array substrate, comprising:
a plurality of pixel units and sensing lines;
wherein each of the pixel units comprises a driving transistor, a first transistor, a capacitor and a light emitting element; and sensing lines are configured to transmit an output current of each driving transistor to a sensing device; the first transistor is connected to the capacitor and configured to write a data voltage into the capacitor; the capacitor is connected to the driving transistor and configured to store the data voltage; and the driving transistor is connected to the light emitting element, and configured to drive the light emitting element to emit light according to the data voltage;
wherein outputting terminals of at least two adjacent driving transistors of the plurality of the driving transistors are connected through at least one first switching element; and
wherein the at least one first switching element is connected to a second switching element, and an outputting terminal of at least one driving transistor other than the at least two adjacent driving transistors is connected to a corresponding sensing line through the second switching element.

2. The array substrate of claim 1, wherein all of driving transistors in the pixel unit have their outputting terminals connected in series through a plurality of first switching elements, and one of the driving transistors in the pixel unit has its outputting terminal connected to the corresponding sensing line through the second switching element.

3. The array substrate of claim 2, wherein the plurality of first switching elements in the pixel unit have controlling terminals on which same controlling voltages are applied.

4. The array substrate of claim 2, wherein the plurality of first switching elements in the pixel unit have controlling terminals on which different controlling voltages are applied.

5. The array substrate of claim 1, wherein the driving transistors with their outputting terminals connected in series have controlling terminals on which different controlling signals are applied.

6. The array substrate of claim 1, wherein the light emitting element is an organic electroluminescence unit.

7. The array substrate of claim 1, wherein the first switching element and the second switching element are switching transistors.

8. The array substrate of claim 1, wherein the array substrate comprises a plurality of columns of pixel units and a plurality of sensing lines, wherein one sensing line is connected to one column of pixel units.

9. A display panel comprising the array substrate of claim 1.

10. A display apparatus comprising the display panel of claim 9.

11. A current measuring method for measuring a driving current outputted from a selected driving transistor of the array substrate of claim 1, comprising:
    turning on a selected second switching element between an outputting terminal of the selected driving transistor to be detected and the corresponding sensing line, so as to connect the selected driving transistor and the corresponding sensing line electronically;
    driving the selected driving transistor to be detected to generate the driving current; and
    measuring the driving current through the corresponding sensing line.

12. The current measuring method of claim 11, further comprising: applying a reference voltage lower than a turn-on voltage of the organic electroluminescence unit to the outputting terminal of the selected driving transistor to be detected through the corresponding sensing line.

13. The current measuring method of claim 11, wherein measuring the driving current through the corresponding sensing line comprising:
    detecting a change of the voltage of the corresponding sensing line during a preset period; and
    obtaining a value of the driving current according to the change of the voltage of the corresponding sensing line during the preset period.

14. A display panel comprising the array substrate of claim 2.

15. A display panel comprising the array substrate of claim 3.

16. A display panel comprising the array substrate of claim 4.

17. A display panel comprising the array substrate of claim 5.

* * * * *